United States Patent
Yaguchi et al.

(10) Patent No.: US 7,216,327 B2
(45) Date of Patent: May 8, 2007

(54) DEVICE FOR ESTIMATING NUMBER OF BOARD LAYERS CONSTITUTING BOARD, SYSTEM INCLUDING THE DEVICE, AND METHOD FOR ESTIMATING THE SAME AND PROGRAM FOR EXECUTING THE METHOD

(75) Inventors: Takahiro Yaguchi, Kanagawa (JP); Seishi Eya, Kanagawa (JP)

(73) Assignee: NEC Informatec Systems, Ltd., Tokyo (JP)

( * ) Notice: Subject to any disclaimer, the term of this patent is extended or adjusted under 35 U.S.C. 154(b) by 481 days.

(21) Appl. No.: 10/777,103

(22) Filed: Feb. 13, 2004

(65) Prior Publication Data

US 2005/0278679 A1    Dec. 15, 2005

(30) Foreign Application Priority Data

Feb. 17, 2003    (JP)    ............................. 2003-038419

(51) Int. Cl.
  G06F 17/50    (2006.01)
(52) U.S. Cl. .......................................... 716/15; 716/14
(58) Field of Classification Search .............. 716/12–15
  See application file for complete search history.

(56) References Cited

U.S. PATENT DOCUMENTS

| 5,745,371 | A * | 4/1998 | Shouen ......................... 716/15 |
| 6,643,839 | B1 * | 11/2003 | Nishio et al. .................. 716/15 |
| 2002/0178429 | A1 * | 11/2002 | Nakayama et al. ............ 716/15 |
| 2003/0115568 | A1 * | 6/2003 | Miller et al. .................. 716/15 |

FOREIGN PATENT DOCUMENTS

| JP | 6-236419 A | 8/1994 |
| JP | 2000-331038 A | 11/2000 |
| JP | 2002-56045 A | 2/2002 |

* cited by examiner

Primary Examiner—Jack Chiang
Assistant Examiner—Binh Tat
(74) Attorney, Agent, or Firm—Sughrue Mion, PLLC (57) ABSTRACT

A device for estimating the required number of board layer to provide necessary wiring in a printed circuit board or a LSI package, a system including the device, a method and a program for estimating the same. In this system, positional information of pins mounted to each component and a board, and connection information between pins are retrieved from a pin positional information file and a net list file. Further, information about an order of layers to be added, a diameter of a via in respective layers and obstacles to wiring is retrieved from the net list file an added layer structure defining file. Thereafter, information about a layer structure, vias, an area where wiring is prohibited is stored in a storage. A wiring route searching section determines whether or not it is possible to form necessary wiring under the present structure. When the wiring route searching section determines it to be impossible, a layer in the next order is added according to information about added layers. Subsequently, the wiring route searching section judges the possibility again. When determining it to be possible, the wiring route searching section outputs the present layer structure to an output device. By this means, it becomes possible to estimate a layer structure and the number of layers.

16 Claims, 6 Drawing Sheets

DEVICE FOR ESTIMATING NUMBER OF BOARD LAYERS CONSTITUTING BOARD, SYSTEM INCLUDING THE DEVICE, AND METHOD FOR ESTIMATING THE SAME AND PROGRAM FOR EXECUTING THE METHOD

BACKGROUND OF THE INVENTION

The present invention relates to a device for estimating the required number of board layers constituting a printed circuit board or a LSI package to form predetermined wirings therein, a system including the device, a method for estimating the same, and a program for executing the method.

DESCRIPTION OF THE RELATED ART

When automatically designing wiring layout in a printed circuit board or LSI (Large-Scale Integration) package having a multilayer structure, it is necessary to estimate the number of board layers constituting a circuit board in consideration of shapes of vias necessary for electrically connecting different layers to obtain the whole design of wirings.

Figure 1:
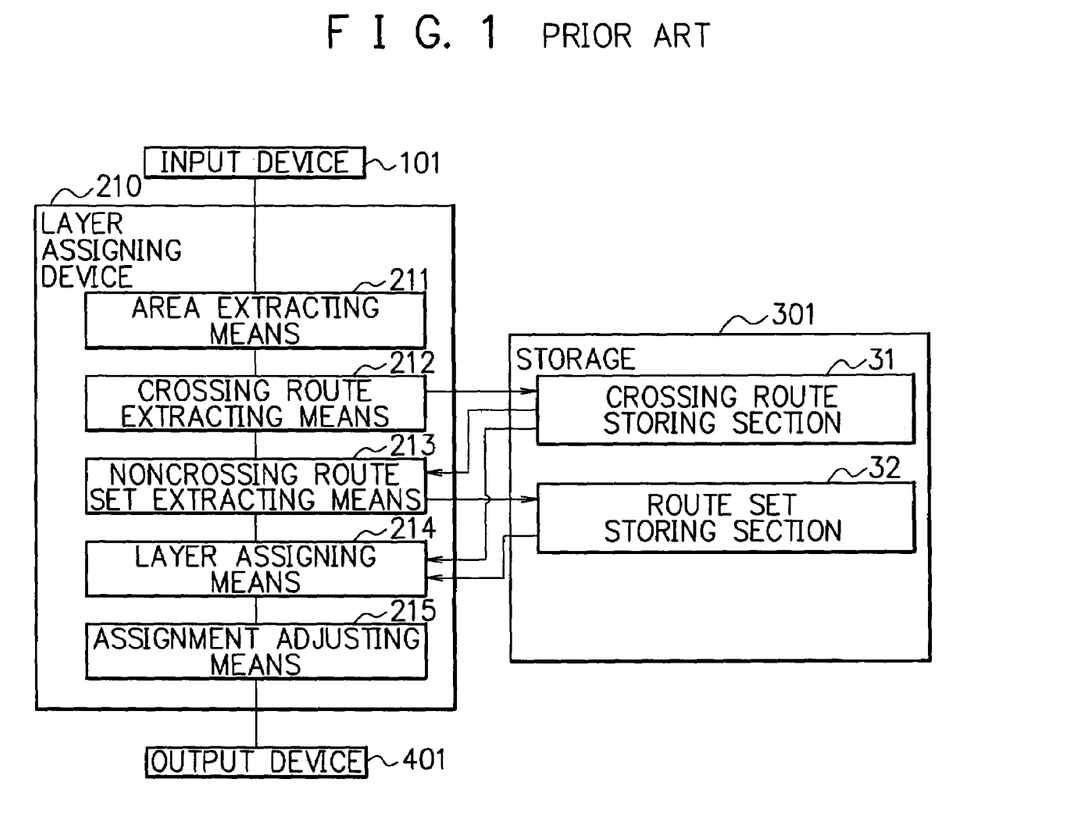
FIG. 1 is a block diagram showing a configuration of an approximate wiring route layer assigning system according to a conventional technique for estimating the number of vias and layers.

An example of a conventional system for estimating the number of vias and layers is proposed in Japanese Patent Application Laid-Open No. 2000-331038. FIG. 1 is a block diagram for explaining an approximate wiring route layer assigning system proposed in the above application. As shown in FIG. 1, the approximate wiring route layer assigning system comprises an area extracting means 211, crossing route extracting means 212, a noncrossing route set extracting means 213, a layer assigning means 214 and an assignment adjusting means 215.

In this system with this configuration, the number of vias and layers are estimated as follows. The layer assigning means 214 assigns layers in reference to crossing route information, a noncrossing route set information and a remaining route set information. Subsequently, the assignment adjusting means 215 determines whether or not it is possible for the layer assigning means 214 to perform assignment of layers. When determining that it is impossible, the means 215 adjusts the layer assignment again.

However, the object of this prior art is to estimate the number of vias in the fixed number of layers. Therefore, it is impossible to estimate the number of necessary layers when dealing with a printed circuit board provided with lead-in wires of BGA (Ball Grid Array) and a LSI package in which the number of vias allowed to be used is predetermined.

Another example of a device and method for supporting a design of a printed circuit board is proposed in Japanese Patent Application Laid-Open No. 2002-056045. In this prior art, a wiring capacity, a ratio of wiring inhibition, a ratio of the number of wards, and a ratio of mounted components are calculated from design information on circuit diagrams, components and boards input from a board designing information inputting section, a proposed mounting specification input from a mounting specification inputting section, and data obtained through past performances. Subsequently, a comparing section compares the calculated result with the past performance data obtained from a performance data inputting section. The compared result is displayed on a displaying section. On the occasion of designing a printed circuit board, it is estimated at an early stage whether or not a capacity for forming wirings and mounting components are still within the allowable range. By this means, the mounting specification including the number of signal layers and the number of channels is determined. Namely, the technique proposed in this application adopts a reverse procedure to the former application, that is, the number of necessary board layers is estimated while the number of vias is predetermined.

In the latter application, there is placed greater emphasis on the calculations with less error of a wiring capacity, a ratio of wiring inhibition, a ratio of the number of wards, and a ratio of mounted components so as to accurately evaluate the capacity for forming wiring and mounting components. This would be an aid to effective and rapid determination of the mounting specification such as the number of signal layers, the number of channels and the like.

The recent miniaturized printed circuit boards and LSI packages have necessitated effective and rapid technique for wiring design. To this end, there is a need to take account of the a wiring capacity, a ratio of wiring inhibition, a ratio of the number of wards, and a ratio of mounted components. In addition to this, it is necessary to consider an effective wiring in consideration of the number of target layers, the positions and forms of vias therein, etc. and to consider whether or not a complete route of wiring is secured in which all available wirings are completely made. This is because, in the course of determining an actual layer structure, there is a need to change the position of vias in a wiring route as another layer is added between board layers. Accordingly, there is a need to consider in what point a via is to be mounted when another layer is added. However, the need will not be satisfied even by the technique proposed in the latter application.

SUMMARY OF THE INVENTION

It is therefore an object of the present invention to provide a device for estimating the number of board layers constituting a circuit board, whereby it becomes possible to estimate the number of layers required for constituting a printed circuit board or LSI package by searching for a wiring route in consideration of information about an order of layers to be added to the board or the package and obstacles such as vias in the additional layer, a system including the device, a method for estimating the same and a program for executing the method.

It is another object of the present invention to provide a device for estimating the number of board layers constituting a circuit board by referring to a result of net assignment, the result being used as an index of combination of pins in pin groups in which arbitrary two pins in different pin groups can be connected, when checking a connection state of pins to be mounted to the board layer, a system including the device, a method for estimating the same and a program for executing the method.

It is further another object of the present invention to provide a device for estimating the number of board layers constituting a circuit board in which there is employed a valid criterion in determining whether or not to output a layer structure and the number of layers after a layer(s) is added, a system including the device, a method for estimating the same and a program for executing the method.

According to a first aspect of the present invention, for achieving the objects mentioned above, there is provided a device for estimating the number of board layers constituting a board, which is connected to at least one file for storing information about an order of layers to be added, positional information of a component pin, a board pin, a power-source pin, and a ground pin, connection information between a component pin and a board pin, connection information between a power-source pin or a ground pin and a predetermined layer, information about existing wirings, information about an area where wiring is prohibited, and information about a shape of a via, a storage and an output device to which a wired result is output, comprising:

a layer adding section for retrieving from the file the information about an order of layers to be added to form an original layer structure and to store information about the formed original layer structure in the storage;

a via forming section for retrieving from the file positional information of a component pin, a board pin, a power-source pin, and a ground pin, and connection information between a component pin and a board pin to store the information in the storage, and retrieving from the file the connection information from a power-source pin or ground pin to a predetermined layer and the information about a shape of a via to form a via and to store the information and information about the formed via with its shape in the storage;

a wiring prohibited area forming section for retrieving from the file the information about existing wirings and the information about an area where wiring is prohibited to store the information in the storage; and a wiring route searching section for searching for a wiring route in reference to the information stored in the storage to output to the output device a structure of a present board and the number of layers constituting the present board.

According to a second aspect of the present invention, in the first aspect:

the file further stores connection information between a component pin group composed of a plurality of component pins and a board pin group composed of a plurality of board pins;

the via forming section retrieves from the file the connection information between the component pin group and the board pin group to store the information in the storage, and retrieves from the file the connection information between a power-source pin or ground pin and a predetermined layer and the information about a shape of a via to form a via and to store the information and information about the formed via with its shape in the storage; and the wiring route searching section outputs to the output device net assignment information indicating a connection between two pins in the component pin group and the board pin group, respectively, in addition to the structure of the present board and the number of board layers constituting the present board, wherein:

the two pins are arbitrarily selected from the component pin group and the board pin group, respectively.

According to a third aspect of the present invention, in the first aspect:

the wiring route searching section calculates a securement ratio for the wiring route; and when 100% securement ratio for the wiring route is obtained, the wiring route searching section outputs to the output device the structure of the present board and the number of board layers constituting the present board; or when 100% securement ratio for the wiring route is not obtained, the layer adding section retrieves from the file the information about an order of layers to be added to store the information in the storage.

According to a fourth aspect of the present invention, in the second aspect:

the wiring route searching section calculates a securement ratio for the wiring route; and when 100% securement ratio for the wiring route is obtained, the wiring route searching section outputs to the output device the structure of the present board, the number of board layers constituting the present board, and the net assignment information; or when 100% securement ratio for the wiring route is not obtained, the layer adding section retrieves from the file the information about an order of layers to be added to store the information in the storage.

According to a fifth aspect of the present invention, there is provided a system for estimating the number of board layers constituting a board, comprising:

at least one file for storing information about an order of layers to be added, positional information of a component pin, a board pin, a power-source pin, and a ground pin, connection information between a component pin and a board pin, connection information between a power-source pin or a ground pin and a predetermined layer, information about existing wirings, information about an area where wiring is prohibited, and information about a shape of a via;

a storage;

an output device to which a wired result is output; and a device for estimating the number of board layers constituting a board as claimed in any one of claims 1 to 4, wherein:

the device for estimating the number of board layers constituting a board comprises:

a layer adding section for retrieving from the file the information about an order of layers to be added to form an original layer structure and to store information about the formed original layer structure in the storage;

a via forming section for retrieving from the file positional information of a component pin, a board pin, a power-source pin, and a ground pin, and connection information between a component pin and a board pin to store the information in the storage, and retrieving from the file the connection information from a power-source pin or ground pin to a predetermined layer and the information about a shape of a via to form a via and to store the information and information about the formed via with its shape in the storage;

a wiring prohibited area forming section for retrieving from the file the information about existing wirings and the information about an area where wiring is prohibited to store the information in the storage; and a wiring route searching section for searching for a wiring route in reference to the information stored in the storage to output to the output device a structure of a present board and the number of layers constituting the present board.

According to a sixth aspect of the present invention, in the fifth aspect;

the file further stores connection information between a component pin group composed of a plurality of component pins and a board pin group composed of a plurality of board pins;

the via forming section retrieves from the file the connection information between the component pin group and the board pin group to store the information in the storage, and retrieves from the file the connection information between a power-source pin or ground pin and a predetermined layer and the information about a shape of a via to form a via and to store the information and information about the formed via with its shape in the storage; and the wiring route searching section outputs to the output device net assignment information indicating a connection between two pins in the component pin group and the board pin group, respectively, in addition to the structure of the present board and the number of board layers constituting the present board, wherein:

the two pins are arbitrarily selected from the component pin group and the board pin group, respectively.

According to a seventh aspect of the present invention, in the fifth aspect:

the wiring route searching section calculates a securement ratio for the wiring route; and when 100% securement ratio for the wiring route is obtained, the wiring route searching section outputs to the output device the structure of the present board and the number of board layers constituting the present board; or when 100% securement ratio for the wiring route is not obtained, the layer adding section retrieves from the file the information about an order of layers to be added to store the information in the storage.

According to an eighth aspect of the present invention, in the sixth aspect:

the wiring route searching section calculates a securement ratio for the wiring route; and when 100% securement ratio for the wiring route is obtained, the wiring route searching section outputs to the output device the structure of the present board, the number of board layers constituting the present board, and the net assignment information; or when 100% securement ratio for the wiring route is not obtained, the layer adding section retrieves from the file the information about an order of layers to be added to store the information in the storage.

According to a ninth aspect of the present invention, there is provided a method for estimating the number of board layers constituting a board and outputting a wired result, comprising:

a layer adding step for retrieving information about an order of layers to be added, the information being stored in at least one file, to store the information in a storage;

a via forming step for retrieving positional information of a component pin, a board pin, a power-source pin, and a ground pin and connection information between a component pin and a board pin, the information being stored in the file, to store the information in the storage, and retrieving connection information from a power-source pin or ground pin to a predetermined layer and information about a shape of a via, the information being stored in the file, to form a via and to store the information and information about the formed via with its shape in the storage;

a wiring prohibited area forming step for retrieving information about existing wirings and information about an area where wiring is prohibited, the information being stored in the file, to store the information in the storage; and a wiring route searching step for searching a wiring route in reference to the information stored in the storage to output to an output device a structure of a present board and the number of layers constituting the present board.

According to a tenth aspect of the present invention, in the ninth aspect, wherein:

the via forming step further comprises a step of retrieving connection information between a component pin group composed of a plurality of component pins and a board pin group composed of a plurality of board pins, the information being stored in the file, to store the information in the storage, and retrieving the connection information between a power-source pin or ground pin and a predetermined layer and the information about a shape of a via to form a via and to store the information and information about the formed via with its shape in the storage; and the wiring route searching step further comprises a step of outputting to the output device net assignment information indicating a connection between two pins in the component pin group and the board pin group, respectively, in addition to the structure of the present board and the number of board layers constituting the present board, wherein:

the two pins are arbitrarily selected from the component pin group and the board pin group, respectively.

According to an eleventh aspect of the present invention, in the ninth aspect:

the wiring route searching step further comprises a step of calculating a securement ratio for the wiring route; and when 100% securement ratio for the wiring route is obtained, the wiring route searching step further comprises a step of outputting to the output device the structure of the present board and the number of board layers constituting the present board; or when 100% securement ratio for the wiring route is not obtained, the layer adding step further comprises a step of retrieving from the file the information about an order of layers to be added to store the information in the storage.

According to a twelfth aspect of the present invention, in the tenth aspect:

the wiring route searching step further comprises a step of calculating a securement ratio for the wiring route; and when 100% securement ratio for the wiring route is obtained, the wiring route searching step further comprises a step of outputting to the output device the structure of the present board, the number of board layers constituting the present board, and the net assignment information; or when 100% securement ratio for the wiring route is not obtained, the layer adding step further comprises a step of retrieving from the file the information about an order of layers to be added to store the information in the storage.

According to a thirteenth aspect of the present invention, there is provide a program for estimating the number of board layers constituting a board and outputting a wired result, to have a computer execute:

a layer adding process for retrieving information about an order of layers to be added, the information being stored in at least one file, to store the information in a storage;

a via forming process for retrieving positional information of a component pin, a board pin, a power-source pin, and a ground pin and connection information between a component pin and a board pin, the information being stored in the file, to store the information in the storage, and retrieving connection information from a power-source pin or ground pin to a predetermined layer and information about a shape of a via, the information being stored in the file, to form a via and to store the information and information about the formed via with its shape in the storage;

a wiring prohibited area forming process for retrieving information about existing wirings and information about an area where wiring is prohibited, the information being stored in the file, to store the information in the storage; and a wiring route searching process for searching a wiring route in reference to the information stored in the storage to output to an output device a structure of a present board and the number of layers constituting the present board.

According to a fourteenth aspect of the present invention, in the thirteenth aspect:

the via forming process further comprises a process for retrieving connection information between a component pin group composed of a plurality of component pins and a board pin group composed of a plurality of board pins, the information being stored in the file, to store the information in the storage, and retrieving the connection information between a power-source pin or ground pin and a predetermined layer and the information about a shape of a via to form a via and to store the information and information about the formed via with its shape in the storage; and the wiring route searching process further comprises a process for outputting to the output device net assignment information indicating a connection between two pins in the component pin group and the board pin group, respectively, in addition to the structure of the present board and the number of board layers constituting the present board, wherein:

the two pins are arbitrarily selected from the component pin group and the board pin group, respectively.

According to a fifteenth aspect of the present invention, in the thirteenth aspect:

the wiring route searching process further comprises a process for calculating a securement ratio for the wiring route; and when 100% securement ratio for the wiring route is obtained, the wiring route searching process further comprises a process for outputting to the output device the structure of the present board and the number of board layers constituting the present board; or when 100% securement ratio for the wiring route is not obtained, the layer adding process further comprises a process for retrieving from the file the information about an order of layers to be added to store the information in the storage.

According to a sixteenth aspect of the present invention, in the fourteenth aspect:

the wiring route searching process further comprises a process for calculating a securement ratio for the wiring route; and when 100% securement ratio for the wiring route is obtained, the wiring route searching process further comprises a process for outputting to the output device the structure of the present board, the number of board layers constituting the present board, and the net assignment information; or when 100% securement ratio for the wiring route is not obtained, the layer adding process further comprises a process for retrieving from the file the information about an order of layers to be added to store the information in the storage.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring now to the drawings, embodiments of the present invention are explained in detail.

[Configuration of First Embodiment]

Figure 2:
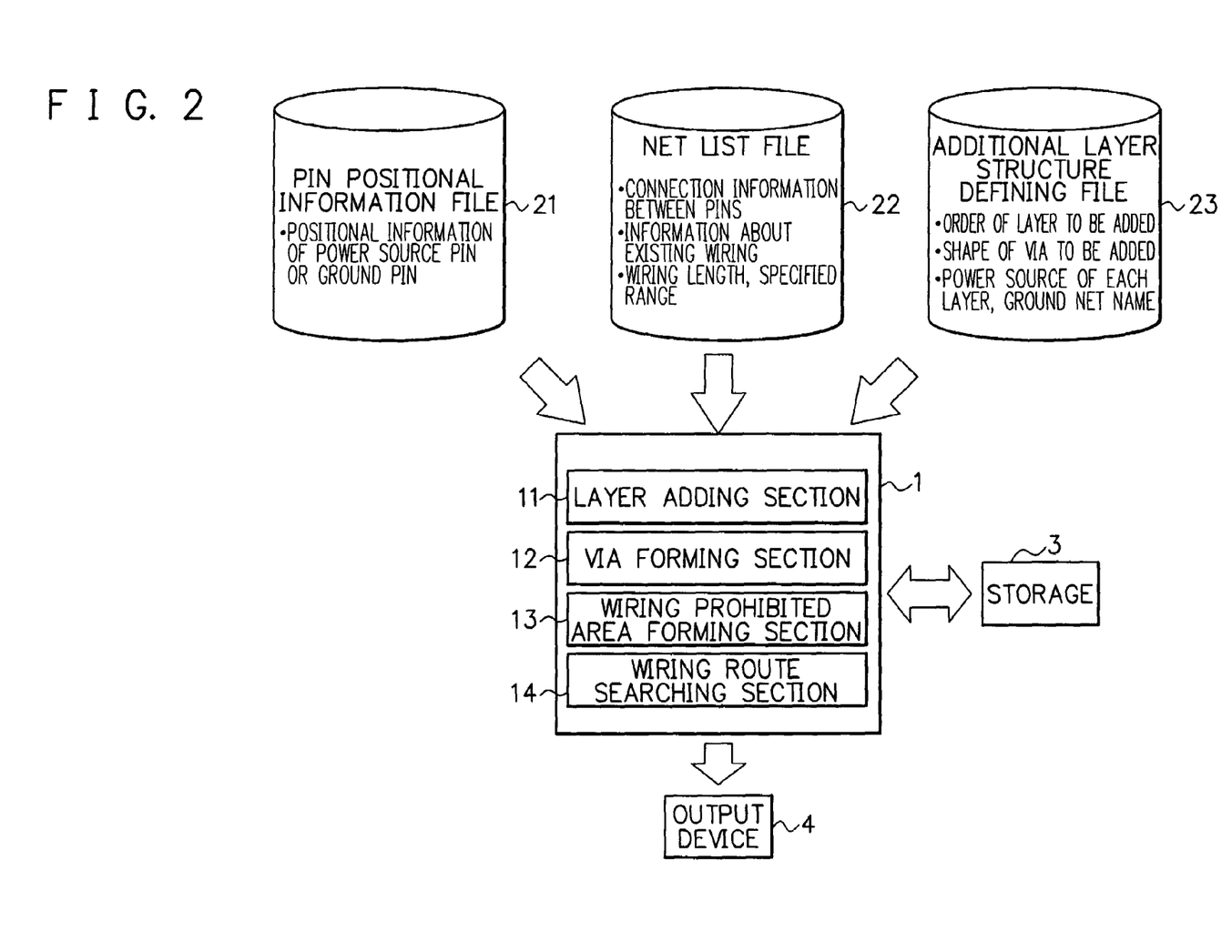
FIG. 2 is a block diagram showing a configuration of a system for estimating the number of board layers according to a first embodiment of the present invention.

In reference to FIG. 2, a system for estimating the number of board layers constituting a board according to the first embodiment of the present invention comprises a device 1 for estimating the number of board layers constituting a board, a pin positional information file (database) 21, a net list file (database) 22, an additional layer structure defining file (database) 23, a storage 3, and an output device 4. The device 1 is connected to the files 21 to 23, the storage 3 and the output device 4.

The device 1 is operated under a program control. The device 1 comprises a layer adding section 11, a via forming section 12, a wiring prohibited area forming section 13, and a wiring route searching section 14. These sections roughly operate as follows.

The layer adding section 11 forms and stores in the storage 3 an original layer structure on the basis of information about an order of layers to be added, the information having been retained in the additional layer structure defining file 23.

The via forming section 12 retrieves positional information about component pins (pins of a component to be mounted on the original circuit board), board pins (pins of the original circuit board) a power-source pin(s) or a ground pin(s) and connection information between a component pin and a board pin from the pin positional information file 21 and the net list file 22, respectively. The net list file 22 retains a net list which indicates the connection information between a component pin and a board pin. Subsequently, the section 12 forms a via from the position of the power-source pin or the ground pin to a power-source layer or a ground layer by referring to power-source/ground net-name information of respective layers (the information indicating a power-source layer and a ground layer, namely, to which layer the via from the power source pin or the ground pin is terminated), the information being defined and stored in the additional layer structure defining file 23. Here at, the section 12 retrieves information about a shape of the via from the additional layer structure defining file 23. Then, the section 12 stores information about the formed via including its shape in the storage 3.

The wiring prohibited area forming section 13 retrieves from the net list file 22 information about obstacles to wiring such as existing wiring and an area where wiring is prohibited, and stores the information in the storage 3.

The wiring route searching section 14 calculates what percent of a wiring route between an indicated component pin and a board pin is secured under the present layer structure in consideration of the information about the obstacles that has been stored in the storage 3, and another information stored in the storage 3.

When 100% of the wiring route is secured, the wiring route searching section 14 determines the layer structure and the number of board layers of the present board (circuit board) as a requirement, and outputs the wired result to the output device 4.

[Operation of First Embodiment]

In the following, an explanation will be given of an entire operation of the device 1 according to the first embodiment in detail in reference to the block diagram of FIG. 2 and the flowchart of FIG. 3.

First, the layer adding section 11 retrieves information about an order of layers to be added from the additional layer structure defining file to obtain (form) an original layer structure. Subsequently, the section 11 stores the information in the storage 3 (Step S11).

Subsequently, the via forming section 12 retrieves the positional information about component pins, board pins, a power-source pin and a ground pin from the pin positional information file 21. Further, the section 12 retrieves connection information between a component pin and a board pin from the net list file 23. Moreover, the section retrieves power-source/ground net-name information of respective layers from the file 23. The power-source/ground net-name information indicates connection information from a power source pin or a ground pin to a predetermined layer. Thereafter, the section 12 forms a via from the position of the power-source pin or the ground pin to a power-source layer or a ground layer by referring to the power-source/ground net-name information in the additional layer structure defining file 23, and stores the retrieved information and information about the formed via with its shape in the storage 3 (Step S12).

Subsequently, the wiring prohibited area forming section 13 retrieves information about obstacles such as information about existing wiring and information about area where wiring is prohibited from the net list file 22. Thereafter, the section 13 stores the information about existing wiring, the diameter of the via, and the information about the area where wiring is prohibited, which become obstacles when forming wiring on the circuit board (Step S13).

Subsequently, the wiring route searching section 14 searches for a wiring route between a component pin and a board pin indicated in the connection information between a component pin and a board pin in consideration of the obstacles such as the formed via, the existing wiring, and the area where wiring is prohibited (Step S14).

As a result of the searching at Step S14, when 100% of the wiring route is secured (Step S15/Yes), the wiring route searching section 14 outputs the layer structure and the number of the layers stored at Step S11 to the output device 4. In this case, the information about the original structure may not be updated.

On the other hand, when 100% of the wiring route is not secured (Step S15/No), the operation procedure goes back to Step S11. Then, the layer adding section 11 obtains information of a layer to be added next time from the additional layer structure defining file 23, adds it to the existing layer structure and stores the information about the added layer in the storage 3 (Step S11).

The device 1 repeats the Steps S11 to S15 until the securement ratio becomes 100% and the wiring route searching section 14 outputs the layer structure and the number of the layers to the output device 4. Incidentally, when the structure of the original circuit board is changed, the information about the original circuit board may be updated or the changed information may be newly recorded in the file 21 to 23.

[Concrete Example of First Embodiment]

In the following, an explanation will be given of a concrete example of operation procedure of the device 1 according to the first embodiment in reference to FIG. 4.

First, the layer adding section 11 obtains an initial layer structure composed of layers P1 to P5 on the basis of the information about an order of layers to be added. Then, the section 11 stores the information in the storage 3 as shown in FIG. 4.

Subsequently, the via forming section 12 retrieves the positional information of component pins (pins P21 to P24 on a component P11, etc.) and board pins (P31 to P34 originally mounted to the original circuit board) from the pin positional information file 21. Then, the section 11 stores the information in the storage 3. Thereafter, the section 12 retrieves the connection information between a component pin and a board pin from the net list file 22. Then, the section 12 stores the information in the storage in the storage 3. In FIG. 4, the doted line as P71 shows an example of one of the combinations of connections between a component pin and a board pin.

On this occasion, when a power-source pin or a ground pin is found in reference to the net list file 22 and the additional layer structure defining file 23, the via forming section 12 forms a via to connect the pin to a layer to which the same net name as that of the pin is defined.

For example, it is assumed that the pin P22 is recognized as a ground pin and the pin P33 is recognized as a power-source pin in reference to he net list file 22 and the additional layer structure defining file 23. Further, it is assumed that the net name defined to the ground pin P22 is identical to that defined to the layer P4 and the net name defined to the power-source pin P33 is identical to that defined to the layer P3, which is defined in the power-source/ground net-name information stored in the file 23.

Figure 4:
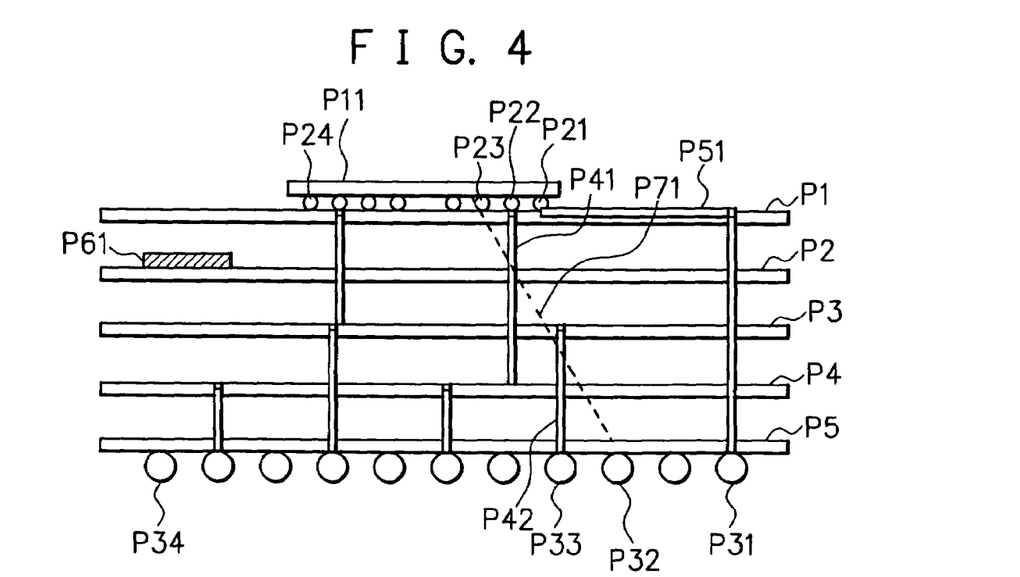
FIG. 4 is a schematic diagram showing a layer structure according to a concrete example of the first embodiment.

In the case, since the net name defined to the ground pin P22 and the layer P4 is identical, the via forming section 12 regards the layer P4 as a ground layer and forms a via P41 from the ground pin P22 to the ground layer P4 as shown in FIG. 4. In the same manner, since the net name defined to the power-source pin P33 and to the layer P3 is identical, the section 12 regards the layer P3 as a power-source layer and forms a via P42 from the power-source pin P33 to the power-source layer P3. Subsequently, the via forming section 12 stores the information about the formed vias P41 and P42, the information including the shapes of the via P41 and P42, respectively, in the storage 3.

Incidentally, the above-described procedure of via formation is applicable when dealing with an embedded-type via. When dealing with a through-type via, the via forming section 12 forms a via so as to pass through all of the layers (from P1 to P5). The type of via is specified in the additional layer structure defining file 23.

Subsequently, the wiring prohibited area forming section 13 refers to the net list file 22 to retrieve information about existing wiring, a via P51, and a wiring prohibited area P61 therefrom. Subsequently, the section 13 stores those information in the storage 3.

Thereafter, the wiring route searching section 14 calculates the percent of the wiring secured for the connection P71 in consideration of the range of wiring length, etc., which is specified in the net list file 22, (Step S15 in FIG. 3) on the basis of the information stored in the storage 3 such as the information about the pins, existing wiring, vias, wiring prohibited area, and formed vias.

As a result of the calculation, when succeeding in obtaining 100% securement ratio for the wiring route, the wiring route searching section 14 outputs the structure of the present board and the number of layers therein to the output device 4. The output layer structure and the number of layers are regarded as requirements at this time.

On the other hand, when the wiring route searching section 14 fails in obtaining 100% securement ratio for the wiring route, the layer adding section 11 retrieves information about a layer to be added next (P81 in FIG. 5) from the additional layer structure defining file 23, and stores the layer configuration in the storage 3 in addition to the present layer configuration (layer P81 in addition to the layers P1 to P5). Subsequently, the processes from Step S12 are repeated again on the basis of this layer configuration and the section 14 calculates again the securement ratio for the wiring route P71 in FIG. 5. In this case, the via forming section 12 forms a power source via to the position of P91. Namely, an obstacle to the wiring route P71 exists at the position of P91 in the added wiring layer P81.

On the other hand, when a layer P82 is added instead of the layer P81, the via forming section 12 forms a ground via to the position of P92. Subsequently, the section 14 calculates the securement ratio for the wiring route P71 in FIG. 5. Namely, an obstacle to the wiring route P71 exists at the position of P92 in the added wiring layer P82.

Figure 5:
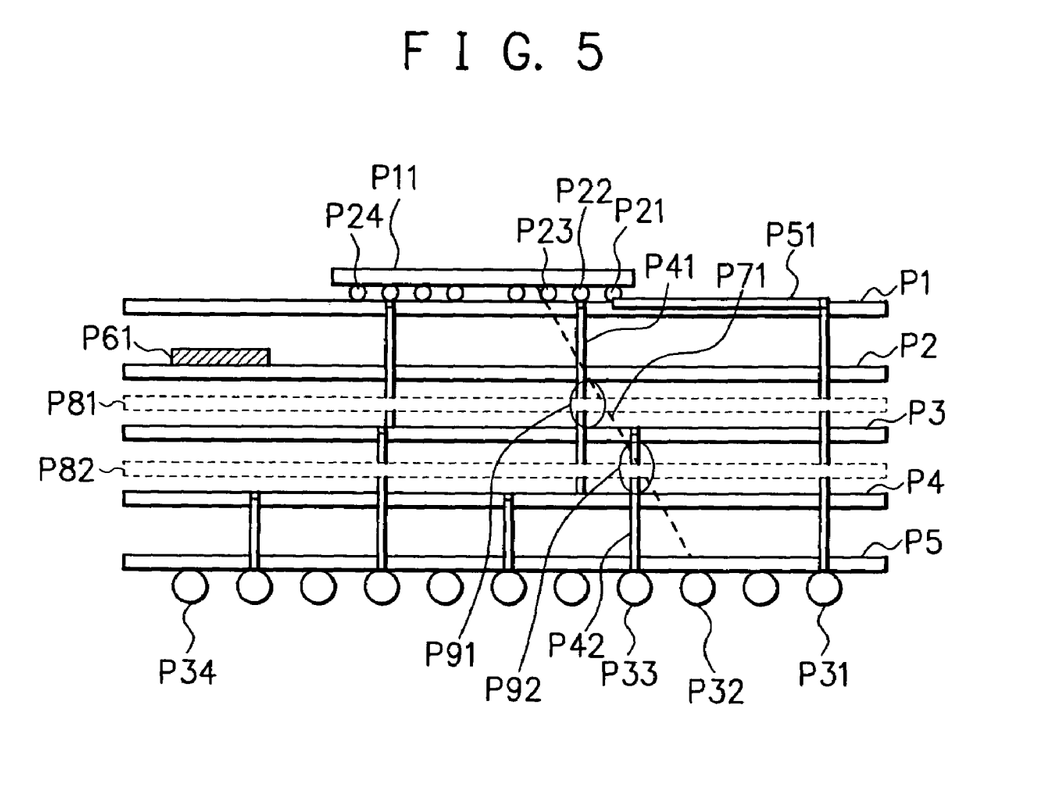
FIG. 5 is a schematic diagram showing a layer structure according to a concrete example of the first embodiment.

As described above, the position of an obstacle to a wiring route changes according to the position where a layer is added. This has an effect on the search for a wiring route. Accordingly, when adding wiring layers, it is important to specify the order of layers to be added. In this connection, the device 1 successfully operates in consideration of the order of added layers.

[Configuration of Second Embodiment]

In the following, an explanation will be given of a second embodiment of the present invention in detail.

Figure 6:
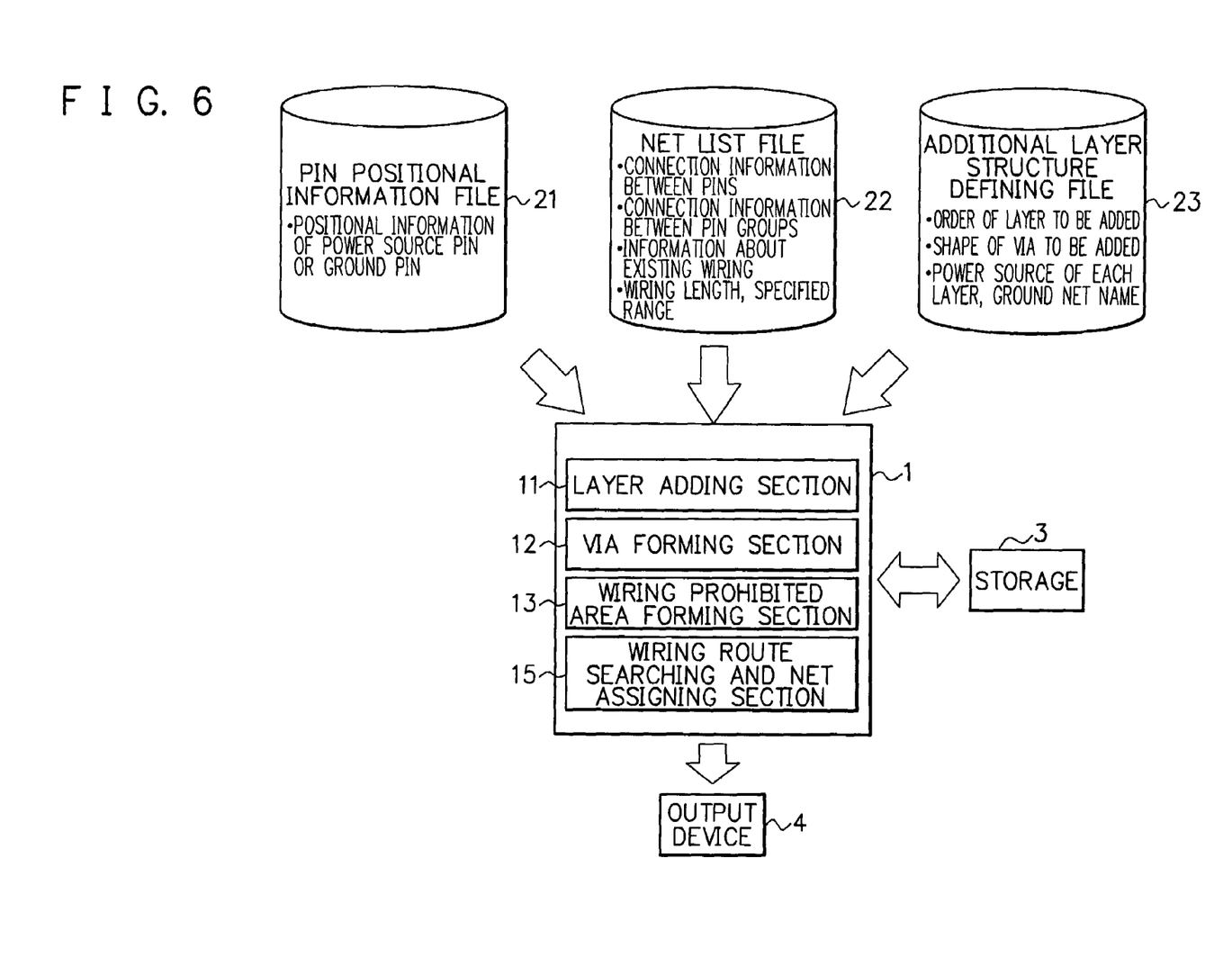
FIG. 6 is a block diagram showing a configuration of a system for estimating the number of board layers according to a second embodiment of the present invention.

In reference to FIG. 6, a system for estimating the number of board layers according to the second embodiment of the present invention has the same configuration as that of the first embodiment except that the wiring route searching section 14 is replaced by a wiring route searching and net assigning section 15. The respective sections denoted by the same reference numerals as in the first embodiment operate in the same manner as in the first embodiment, thereby abbreviating the explanations.

In the second embodiment, a plurality of pins constitutes a pin group. A plurality of pins may be divided into a group on a predetermined basis. For example, the plural pins may be divided into a group according to a voltage applied to the plural pins. For another example, the plural pins may be divided into a group by the kinds of the pins, for example, by analogue pins or digital pins. It is also possible to set another basis for the grouping. Hereinafter a pin group composed of pins of a component mounted to a circuit board is referred to as a component pin group, and a pin group composed of pins originally mounted to the circuit board is referred to as a board pin group. By this configuration, it is possible to arbitrarily select a pin from the component pin group and the board pin group, respectively, to establish a connection therebetween.

Incidentally, the net list file 22 according to the second embodiment retains connection information between a component pin group and a board pin group in addition to the information described in the first embodiment.

The wiring route searching and net assigning section 15 calculates the percent of a secured wiring route under a present layer structure stored in the storage 3 in consideration of the information about vias, existing wiring, wiring prohibited area, positional information and connection information between a component pin and a board pin, and connection information between a component pin group and a board pin group retrieved from the files 21 to 23.

Furthermore, the device 1 outputs to the output device 4 net assignment information in addition to the configuration of a present board and the number of layers as requirements when the wiring route searching and net assigning section 15 obtains 100% securement ratio. The net assignment information is the information of a connection between two pins selected from the component pin group and the board pin group, respectively.

[Operation of Second Embodiment]

In the following, an explanation will be given in detail of an operation of the second embodiment of the present invention in reference to FIGS. 6 and 7.

Figure 3:
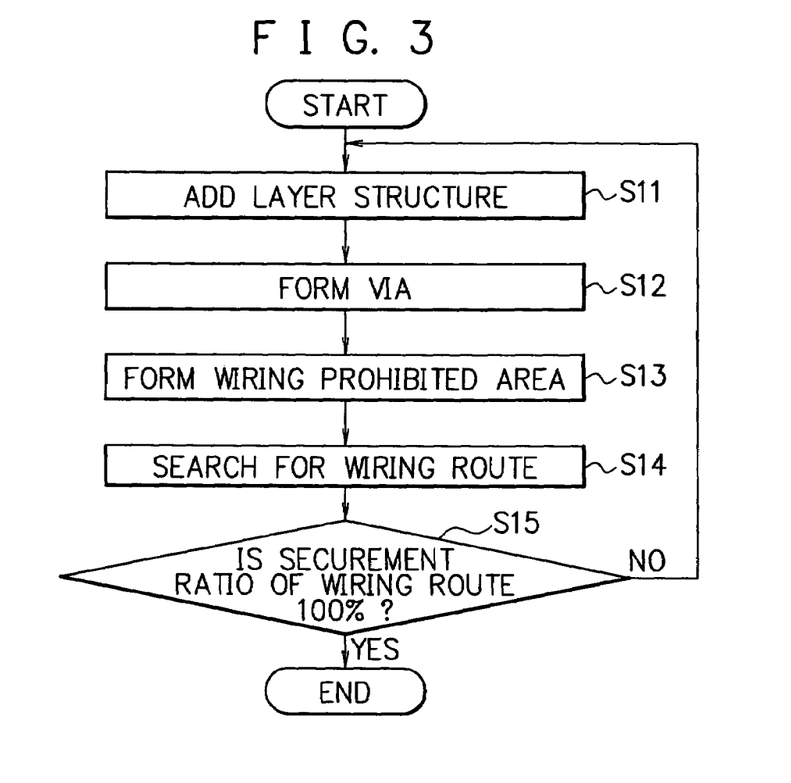
FIG. 3 is a flowchart for explaining an operational procedure of the system according to the first embodiment.
Figure 7:
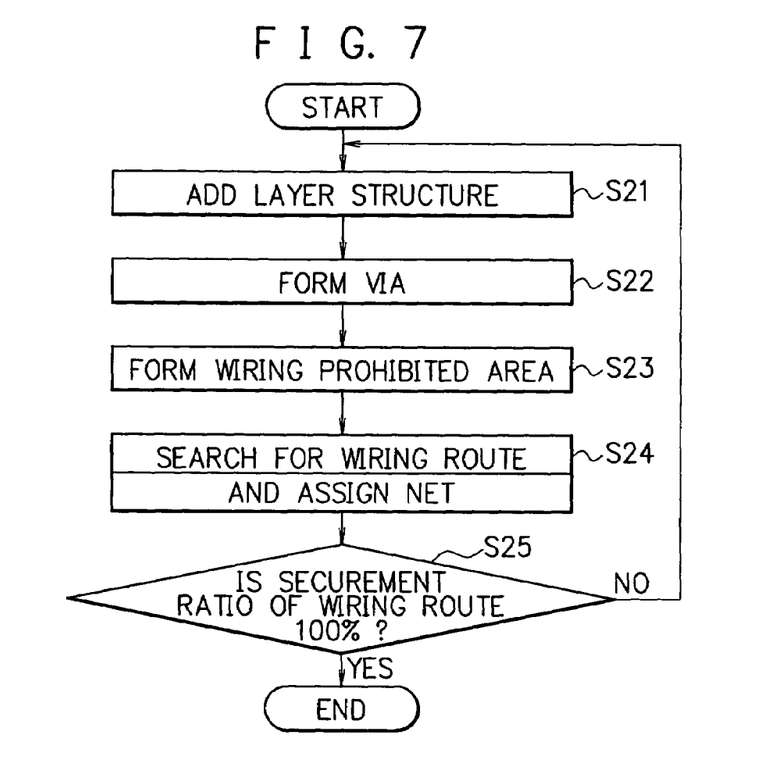
FIG. 7 is a flowchart showing an operational procedure of the system according to the second embodiment.

The operation executed at Steps S21 to 23 in FIG. 7 in the second embodiment is the same as Steps S11 to S13 in FIG. 3 in the first embodiment, thereby abbreviating the explanation.

After Step S23, the wiring route searching and net assigning section 15 searches for a wiring route (Step S24) under the structure on the basis of the information stored in the storage 3 in consideration of the information about obstacles to wiring. Namely, the section 15 calculates the percent of a secured wiring route in consideration of the above-described retrieved information.

As a result of Step S24, when succeeding in obtaining 100% securement ratio for the wiring route (Step S25/Yes), the wiring route searching and net assigning section 15 outputs the layer structure, the number of the layers and the net assignment information of the present circuit board structure to the output device 4.

On the other hand, when the wiring route searching and net assigning section 15 fails in obtaining 100% securement ratio for the wiring route (Step S25/No), the operation procedure goes back to Step S21. Then, the layer adding section 11 obtains information about a layer to be added from the additional layer structure defining file 23, adds it to the existing layer structure and stores the information about the added layer in the storage 5.

The device 1 repeats the Steps S21 to S25 until the securement ratio becomes 100% and the wiring route searching and net assigning section 15 outputs a layer structure, the number of layers and net assignment information to the output device 4.

[Concrete Example of Second Embodiment]

In the following, an explanation will be given of a concrete example of the device 1 according to the second embodiment of the present invention in reference to FIG. 8.

First, the layer adding section 11 refers to the additional layer structure defining file 23 to obtain the information about an original layer structure of five layer structure composed of layers P1 to P5 on the basis of the information about an order of layers to be added. Thereafter, the section 11 stores the information in the storage 3 as shown in FIG. 8.

Subsequently, the via forming section 12 refers to the pin positional information file 21 to retrieve therefrom positional information about component pins, board pins, a power-source pin(s) and a ground pin(s) (component pins P21 to P26 of a component P11 and board pins 31 to 36 originally mounted to the circuit board). Subsequently, the section 12 stores the retrieved information in the storage 3. Thereafter, the section 12 refers to the net list file 22 to retrieve therefrom connection information between a component pin and a board pin (one of the connection information is depicted by P71 in FIG. 8), and connection information between a component pin group and a board pin group (one of the connection information is depicted by P111 between the component pin group P101 and the board pin group P102 in FIG. 8). Subsequently, the section 12 additionally stores the retrieved information in the storage 3.

On this occasion, when a power-source pin and/or a ground pin is identified by reference to the net list file 22 and the additional layer structure defining file 23, the via forming section 12 forms a via to connect the pin to a layer to which the same net name as that of the pin is defined in the power-source/ground net-name information.

For example, it is assumed that the pin P22 is recognized as a ground pin and the pin P33 is recognized as a power-source pin in reference to the net list file 22 and the additional layer structure defining file 23. Further, it is assumed that the net name defined to the ground pin P22 is identical to that of the layer P4 and the net name defined to the power-source pin P33 is identical to that of the layer P3.

Figure 8:
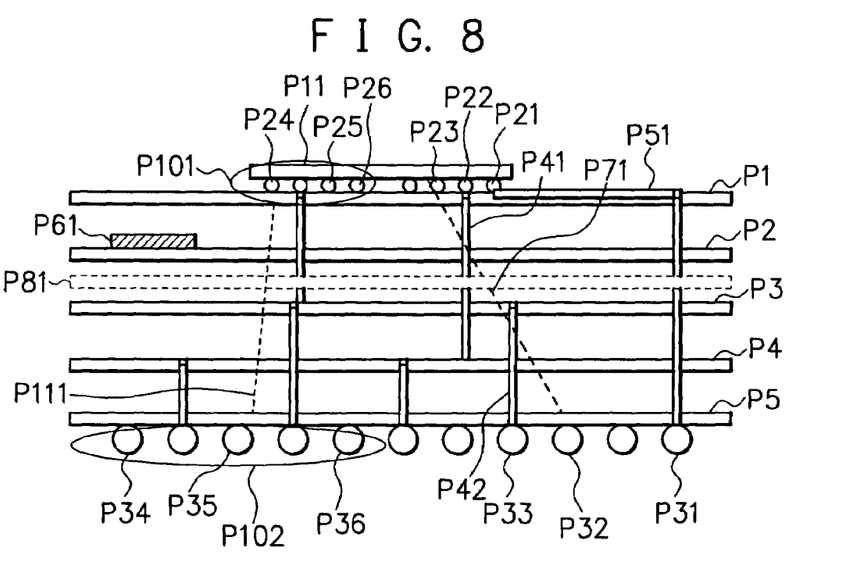
FIG. 8 is a schematic diagram showing a layer structure according to a concrete example of the second embodiment.

In the case, since the net name defined to the ground pin P22 and the layer P4 is identical, the via forming section 12 regards the layer P4 as a ground layer and forms a via P41 from the ground pin P22 to the ground layer P4 as shown in FIG. 8. In the same manner, since the net name defined to the power-source pin P33 and to the layer P3 is identical, the section 12 regards the layer P3 as a power-source layer and forms a via P42 from the power-source pin P33 to the power-source layer P3. Subsequently, the via forming section 12 stores the information about the formed vias P41 and P42, the information including the shapes of the via P41 and P42, respectively, in the storage 3.

Incidentally, the above-described procedure of via formation is applicable when dealing with an embedded-type via. When dealing with a through-type via, the via forming section 12 forms a via so as to pass through all of the layers (from P1 to P5). The type of via is specified in the additional layer structure defining file 23.

Subsequently, the wiring prohibited area forming section 13 refers to the net list file 22 to retrieve therefrom information about existing wiring, via P51 and a wiring prohibited area P61, and additionally stores the retrieved information in the storage 3.

Thereafter, the wiring route searching and net assigning section 15 searches for a wiring route to obtain 100% securement ratio within the specified range of a wiring length, etc. defined in the net list file 22 on the basis of the information that have been stored in the storage 3. Hereat, it is possible to arbitrarily select and connect a component pin and a board pin in the component pin group P101 and the board pin group P102, respectively. Accordingly, the section 15 selects a combination of connection between a component pin and a board pin in the respective component pin group and the board pin group so that the least number of layers is required within the specified range of a wiring length, etc. As a result of the searching, the section 15 determines a combination of connection between the two pins in the component pin group P101 and the board pin group P102, and regards the combination as net assignment information. After the processes of the searching and net assignment, the section 15 calculates the percent of the secured wiring route (Step S25 in FIG. 7).

When failing in obtaining 100 securement ratio for the wiring route, the layer adding section 11 refers to the additional layer structure defining file 23 to retrieve information about a layer to be added next (for example, a layer P81). The section 11 stores the information about the added layer P81 in the storage 3. Subsequently, the processes from Step S22 in FIG. 7 are repeated again on the basis of this layer structure.

When succeeding in obtaining 100% securement ratio for the wiring route, the wiring route securing and net assigning section 15 outputs the present layer structure, the number of layers and the result of the net assignment (net assignment information) to the output device 4. The output layer configuration, the number of the layers and the net assignment information are regarded as requisites at this time.

By dividing a plurality of pins into a group, it becomes possible to reduce noise that is generated when, for example, a circuit board having jumbled analogue pins and digital pins is mounted on another printed circuit board.

Incidentally, in the above-described embodiments, all types of connections are available between the device 1 and the files 21 to 23. Examples of the types of connection include a network such as the Internet, and the like.

Furthermore, in the above-described embodiments, the device 1 is connected to the pin positional information file 21, the net list file 22 and the additional layer structure defining file 23, the storage 3 and the output device 4. However, it is also possible to include the files 21 to 23, the storage 3 and the output device 4 in the device 1. Even by this configuration, it becomes possible to obtain the same effects as those obtained in the above-described embodiments.

As set forth hereinbefore, according to the present invention, it becomes possible to estimate the number of layers required for a printed circuit board or a LSI package. This is because a wiring route is searched in consideration of information about an order of layers added to the printed circuit board or the LSI package and information about obstacles to wiring such as vias in the added layers, etc.

Moreover, when checking a connection between a component pin and a board pin, it becomes possible to estimate the least number of board layers by referring to a result of net assignment, the result being used as an index of combination of connection between a component in and a board pin in a component pin group and a board pin group, respectively, from which arbitrarily two pins can be selected and connected.

Further, it becomes possible to reduce noise generated when the circuit board is mounted on another bard by searching for a wiring route in consideration of the net assignment information.

Furthermore, it becomes possible to rapidly and effectively estimate the number of board layers since there is employed a valid criterion in determining whether or not to output a layer structure, the number of layers and net assignment information after a layer(s) is added.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A device for estimating the number of board layers constituting a board, which is connected to at least one file for storing information about an order of layers to be added, positional information of a component pin, a board pin, a power-source pin, and a ground pin, connection information between a component pin and a board pin, connection information between a power-source pin or a ground pin and a predetermined layer, information about existing wirings, information about an area where wiring is prohibited, and information about a shape of a via, a storage and an output device to which a wired result is output, comprising:

a layer adding section for retrieving from the file the information about an order of layers to be added to form an original layer structure and to store information about the formed original layer structure in the storage;

a via forming section for retrieving from the file positional information of a component pin, a board pin, a power-source pin, and a ground pin, and connection information between a component pin and a board pin to store the information in the storage, and retrieving from the file the connection information from a power-source pin or ground pin to a predetermined layer and the information about a shape of a via to form a via and to store the information and information about the formed via with its shape in the storage;

a wiring prohibited area forming section for retrieving from the file the information about existing wirings and the information about an area where wiring is prohibited to store the information in the storage; and a wiring route searching section for searching for a wiring route in reference to the information stored in the storage to output to the output device a structure of a present board and the number of layers constituting the present board.

2. A device for estimating the number of board layers constituting a board, as claimed in claim 1, wherein;

the file further stores connection information between a component pin group composed of a plurality of component pins and a board pin group composed of a plurality of board pins;

the via forming section retrieves from the file the connection information between the component pin group and the board pin group to store the information in the storage, and retrieves from the file the connection information between a power-source pin or ground pin and a predetermined layer and the information about a shape of a via to form a via and to store the information and information about the formed via with its shape in the storage; and the wiring route searching section outputs to the output device net assignment information indicating a connection between two pins in the component pin group and the board pin group, respectively, in addition to the structure of the present board and the number of board layers constituting the present board, wherein:

the two pins are arbitrarily selected from the component pin group and the board pin group, respectively.

3. A device for estimating the number of board layers constituting a board as claimed in claim 1, wherein:

the wiring route searching section calculates a securement ratio for the wiring route; and when 100% securement ratio for the wiring route is obtained, the wiring route searching section outputs to the output device the structure of the present board and the number of board layers constituting the present board; or when 100% securement ratio for the wiring route is not obtained, the layer adding section retrieves from the file the information about an order of layers to be added to store the information in the storage.

4. A device for estimating the number of board layers constituting a board as claimed in claim 2, wherein:

the wiring route searching section calculates a securement ratio for the wiring route; and when 100% securement ratio for the wiring route is obtained, the wiring route searching section outputs to the output device the structure of the present board, the number of board layers constituting the present board, and the net assignment information; or when 100% securement ratio for the wiring route is not obtained, the layer adding section retrieves from the file the information about an order of layers to be added to store the information in the storage.

5. A system for estimating the number of board layers constituting a board, comprising:

at least one file for storing information about an order of layers to be added, positional information of a component pin, a board pin, a power-source pin, and a ground pin, connection information between a component pin and a board pin, connection information between a power-source pin or a ground pin and a predetermined layer, information about existing wirings, information about an area where wiring is prohibited, and information about a shape of a via;

a storage;

an output device to which a wired result is output; and a device for estimating the number of board layers constituting a board as claimed in any one of claims 1 to 4, wherein:

the device for estimating the number of board layers constituting a board comprises:

a layer adding section for retrieving from the file the information about an order of layers to be added to form an original layer structure and to store information about the formed original layer structure in the storage;

a via forming section for retrieving from the file positional information of a component pin, a board pin, a power-source pin, and a ground pin, and connection information between a component pin and a board pin to store the information in the storage, and retrieving from the file the connection information from a power-source pin or ground pin to a predetermined layer and the information about a shape of a via to form a via and to store the information and information about the formed via with its shape in the storage;

a wiring prohibited area forming section for retrieving from the file the information about existing wirings and the information about an area where wiring is prohibited to store the information in the storage; and a wiring route searching section for searching for a wiring route in reference to the information stored in the storage to output to the output device a structure of a present board and the number of layers constituting the present board.

6. A system for estimating the number of board layers constituting a board, as claimed in claim 5, wherein;

the file further stores connection information between a component pin group composed of a plurality of component pins and a board pin group composed of a plurality of board pins;

the via forming section retrieves from the file the connection information between the component pin group and the board pin group to store the information in the storage, and retrieves from the file the connection information between a power-source pin or ground pin and a predetermined layer and the information about a shape of a via to form a via and to store the information and information about the formed via with its shape in the storage; and the wiring route searching section outputs to the output device net assignment information indicating a connection between two pins in the component pin group and the board pin group, respectively, in addition to the structure of the present board and the number of board layers constituting the present board, wherein:

the two pins are arbitrarily selected from the component pin group and the board pin group, respectively.

7. A system for estimating the number of board layers constituting a board as claimed in claim 5, wherein:

the wiring route searching section calculates a securement ratio for the wiring route; and when 100% securement ratio for the wiring route is obtained, the wiring route searching section outputs to the output device the structure of the present board and the number of board layers constituting the present board; or when 100% securement ratio for the wiring route is not obtained, the layer adding section retrieves from the file the information about an order of layers to be added to store the information in the storage.

8. A system for estimating the number of board layers constituting a board as claimed in claim 6, wherein:

the wiring route searching section calculates a securement ratio for the wiring route; and when 100% securement ratio for the wiring route is obtained, the wiring route searching section outputs to the output device the structure of the present board, the number of board layers constituting the present board, and the net assignment information; or when 100% securement ratio for the wiring route is not obtained, the layer adding section retrieves from the file the information about an order of layers to be added to store the information in the storage.

9. A method for estimating the number of board layers constituting a board and outputting a wired result, comprising:

a layer adding step for retrieving information about an order of layers to be added, the information being stored in at least one file, to store the information in a storage;

a via forming step for retrieving positional information of a component pin, a board pin, a power-source pin, and a ground pin and connection information between a component pin and a board pin, the information being stored in the file, to store the information in the storage, and retrieving connection information from a power-source pin or ground pin to a predetermined layer and information about a shape of a via, the information being stored in the file, to form a via and to store the information and information about the formed via with its shape in the storage;

a wiring prohibited area forming step for retrieving information about existing wirings and information about an area where wiring is prohibited, the information being stored in the file, to store the information in the storage; and a wiring route searching step for searching a wiring route in reference to the information stored in the storage to output to an output device a structure of a present board and the number of layers constituting the present board.

10. A method for estimating the number of board layers constituting a board and outputting a wired result, as claimed in claim 9, wherein:

the via forming step further comprises a step of retrieving connection information between a component pin group composed of a plurality of component pins and a board pin group composed of a plurality of board pins, the information being stored in the file, to store the information in the storage, and retrieving the connection information between a power-source pin or ground pin and a predetermined layer and the information about a shape of a via to form a via and to store the information and information about the formed via with its shape in the storage; and the wiring route searching step further comprises a step of outputting to the output device net assignment information indicating a connection between two pins in the component pin group and the board pin group, respectively, in addition to the structure of the present board and the number of board layers constituting the present board, wherein:

the two pins are arbitrarily selected from the component pin group and the board pin group, respectively.

11. A method for estimating the number of board layers constituting a board and outputting a wired result as claimed in claim 9, wherein:

the wiring route searching step further comprises a step of calculating a securement ratio for the wiring route; and when 100% securement ratio for the wiring route is obtained, the wiring route searching step further comprises a step of outputting to the output device the structure of the present board and the number of board layers constituting the present board; or when 100% securement ratio for the wiring route is not obtained, the layer adding step further comprises a step of retrieving from the file the information about an order of layers to be added to store the information in the storage.

12. A method for estimating the number of board layers constituting a board and outputting a wired result as claimed in claim 10, wherein:

the wiring route searching step further comprises a step of calculating a securement ratio for the wiring route; and when 100% securement ratio for the wiring route is obtained, the wiring route searching step further comprises a step of outputting to the output device the structure of the present board, the number of board layers constituting the present board, and the net assignment information; or when 100% securement ratio for the wiring route is not obtained, the layer adding step further comprises a step of retrieving from the file the information about an order of layers to be added to store the information in the storage.

13. A program for estimating the number of board layers constituting a board and outputting a wired result, to have a computer execute:

a layer adding process for retrieving information about an order of layers to be added, the information being stored in at least one file, to store the information in a storage;

a via forming process for retrieving positional information of a component pin, a board pin, a power-source pin, and a ground pin and connection information between a component pin and a board pin, the information being stored in the file, to store the information in the storage, and retrieving connection information from a power-source pin or ground pin to a predetermined layer and information about a shape of a via, the information being stored in the file, to form a via and to store the information and information about the formed via with its shape in the storage;

a wiring prohibited area forming process for retrieving information about existing wirings and information about an area where wiring is prohibited, the information being stored in the file, to store the information in the storage; and a wiring route searching process for searching a wiring route in reference to the information stored in the storage to output to an output device a structure of a present board and the number of layers constituting the present board.

14. A program for estimating the number of board layers constituting a board and outputting a wired result, as claimed in claim 13, wherein:

the via forming process further comprises a process for retrieving connection information between a component pin group composed of a plurality of component pins and a board pin group composed of a plurality of board pins, the information being stored in the file, to store the information in the storage, and retrieving the connection information between a power-source pin or ground pin and a predetermined layer and the information about a shape of a via to form a via and to store the information and information about the formed via with its shape in the storage; and the wiring route searching process further comprises a process for outputting to the output device net assignment information indicating a connection between two pins in the component pin group and the board pin group, respectively, in addition to the structure of the present board and the number of board layers constituting the present board, wherein:

the two pins are arbitrarily selected from the component pin group and the board pin group, respectively.

15. A program for estimating the number of board layers constituting a board and outputting a wired result as claimed in claim 13, wherein:

the wiring route searching process further comprises a process for calculating a securement ratio for the wiring route; and when 100% securement ratio for the wiring route is obtained, the wiring route searching process further comprises a process for outputting to the output device the structure of the present board and the number of board layers constituting the present board; or when 100% securement ratio for the wiring route is not obtained, the layer adding process further comprises a process for retrieving from the file the information about an order of layers to be added to store the information in the storage.

16. A program for estimating the number of board layers constituting a board and outputting a wired result as claimed in claim 14, wherein:

the wiring route searching process further comprises a process for calculating a securement ratio for the wiring route; and when 100% securement ratio for the wiring route is obtained, the wiring route searching process further comprises a process for outputting to the output device the structure of the present board, the number of board layers constituting the present board, and the net assignment information; or when 100% securement ratio for the wiring route is not obtained, the layer adding process further comprises a process for retrieving from the file the information about an order of layers to be added to store the information in the storage.

* * * * *